United States Patent
Liskow

(10) Patent No.: US 6,953,158 B2
(45) Date of Patent: Oct. 11, 2005

(54) FUEL INJECTION VALVE

(75) Inventor: Uwe Liskow, Asperg (DE)

(73) Assignee: Robert Bosch GmbH, Stuttgart (DE)

(*) Notice: Subject to any disclaimer, the term of this patent is extended or adjusted under 35 U.S.C. 154(b) by 55 days.

(21) Appl. No.: 10/468,537

(22) PCT Filed: Nov. 25, 2002

(86) PCT No.: PCT/DE02/04313
§ 371 (c)(1),
(2), (4) Date: Jan. 23, 2004

(87) PCT Pub. No.: WO03/052260
PCT Pub. Date: Jun. 26, 2003

(65) Prior Publication Data
US 2004/0118951 A1 Jun. 24, 2004

(30) Foreign Application Priority Data
Dec. 18, 2001 (DE) .................. 101 62 250

(51) Int. Cl.⁷ .................................. B05B 1/08
(52) U.S. Cl. ............... 239/102.2; 239/73; 239/533.2; 310/328; 251/77
(58) Field of Search .............. 239/73, 102.1, 239/102.2, 533.2; 310/328, 338, 323.21; 251/77, 129.19, 129.06; 123/496, 464, 498, 499

(56) References Cited

U.S. PATENT DOCUMENTS 5,197,429 A * 3/1993 Kita ................... 123/357
5,483,842 A * 1/1996 Foreman ............... 73/862.392
6,400,066 B1   6/2002 Sumrak et al.
6,478,013 B1 * 11/2002 Boecking ................ 123/467

FOREIGN PATENT DOCUMENTS

| DE | 199 29 589 | 1/2000 |
|----|-----------|--------|
| DE | 198 48 950 | 4/2000 |
| DE | 198 49 203 | 4/2000 |
| DE | 199 05 340 | 8/2000 |
| DE | 199 18 976 | 11/2000 |
| DE | 100 16 474 | 10/2001 |
| DE | 101 30 857 | 3/2002 |
| WO | 03 001049  | 1/2003 |

* cited by examiner

Primary Examiner—Dinh Q. Nguyen
(74) Attorney, Agent, or Firm—Kenyon & Kenyon

(57) ABSTRACT

A fuel injector for the direct injection of fuel into a combustion chamber of an internal combustion engine includes a piezoelectric or magnetostrictive actuator and a valve-closure member able to be actuated by the actuator, the valve-closure member cooperating with a valve-seat surface to form a sealing seat, a compensation gap being present in an actuation path between the actuator and the valve-closure member. A measuring element is provided in the actuator and/or in the actuation path, the measuring element measuring the forces exerted by the actuator the valve-closure member and the actuator being regulated in such a way that the compensation gap is being held closed.

12 Claims, 2 Drawing Sheets

FUEL INJECTION VALVE

FIELD OF THE INVENTION

The present invention is directed to a fuel injector.

BACKGROUND INFORMATION

For instance from German Published Patent Application No. 198 49 203, a fuel injector for fuel-injection systems of internal combustion engines is known. It includes a valve-closure member cooperating with a valve-seat body to form a sealing seat, and a piezoelectric actuator for actuating the valve-closure member. The piezoelectric actuator has piezo-layers and one or a plurality of temperature-compensation layers. The temperature-compensation layers have a thermal expansion coefficient whose sign is the opposite of that of the thermal expansion coefficient of the piezo-layers.

Furthermore, from German Published Patent Application No. 199 18 976, a fuel injector for fuel-injection systems of internal combustion engines is known, which includes a first piezoelectric or magnetostrictive actuator, a valve-closure member, which is actuable by the first actuator by means of a valve needle and cooperates with a valve-seat surface to form a sealing seat, and has a second piezoelectric or magnetostrictive actuator, which acts upon the valve needle counter to the first actuator. The actuators are arranged one after another in the longitudinal direction of the fuel injector and are interconnected by a bearing element, which is permanently supported in the fuel injector.

Disadvantageous in the fuel injector known from German Published Patent Application No. 198 49 203 is that the temperature compensation is implemented by special layers within the actuator, the material of these temperature-compensating layers exhibiting thermal expansions acting in opposite directions. This causes problems, in particular during rapid dynamic operations, since the different materials react differently, due to the dissimilar thermal expansion coefficients. Furthermore, a special actuator with temperature-compensation layers must be developed.

A disadvantage of the fuel injector known from German Published Patent Application No. 199 18 976 is the large overall length that the axially offset arrangement of the actuators necessitates. Also, this large overall length goes hand in hand with a widening of the fuel injector, which the support of the bearing plate calls for.

SUMMARY OF THE INVENTION

In contrast, the fuel injector according to the present invention, having the characterizing features of the main claim, has the advantage over the related art that conventional stack actuators, or actuators having a plurality of separated regions with compensation elements, are able to be controlled by a measuring and regulating device, in such a way that a play compensation for the temperature-related linear deformations of the actuator may be achieved in a simple and inexpensive manner, without the use of expensive INVAR materials.

In this context, it is furthermore advantageous that the separate controlling of the opening actuator and the compensation actuator may be implemented at different speeds, so that the dynamic performance of the fuel injector is not adversely affected, yet the temperature compensation may occur slowly.

In an advantageous manner, the measuring element may be positioned anywhere on the actuator in the flux of force in front of the compensation gap. A prestressing against the measuring element may be achieved by the joint clamping of the measuring element inside the actuator cartridge.

Furthermore, it is advantageous that the measuring element may also be located outside the actuator, for instance may be integrated in the actuating element.

DETAILED DESCRIPTION

Figure 1A:
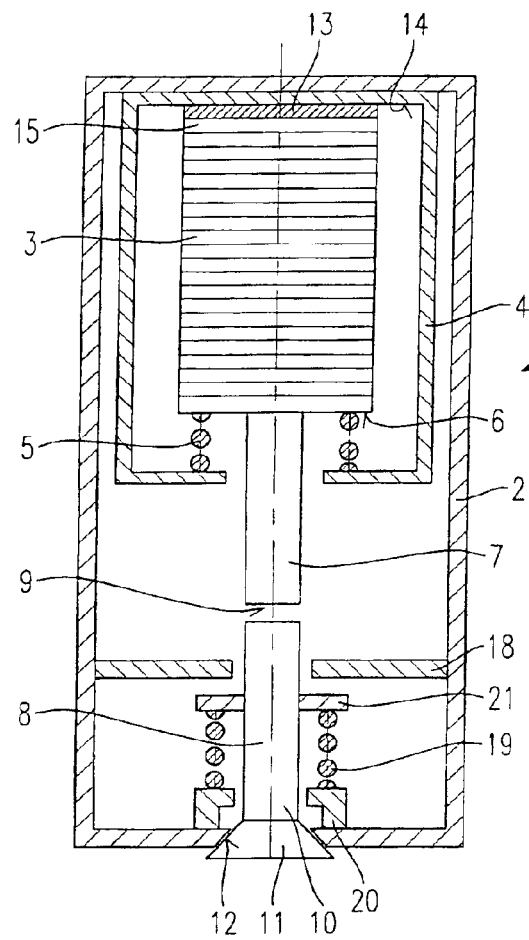
FIG. 1A shows a highly schematized, sectioned representation of a first exemplary embodiment of a fuel injector configured according to the present invention.

In a highly schematized sectioned view, FIG. 1A shows a longitudinal section through the essential components of a fuel injector 1 configured according to the present invention. Fuel injector 1 is embodied as a fuel injector for mixture-compressing internal combustion engines having external ignition. It is especially suited for the direct injection of fuel into a combustion chamber of an internal combustion engine.

Fuel injector 1 encompasses a housing 2 in which a piezoelectric actuator 3 is arranged. Piezoelectric actuator 3 may be made up, for instance, of a plurality of interconnected piezoelectric layers 14. Actuator 3 is encapsulated in an actuator cartridge 4 and prestressed by a compression spring 5 clamped between actuator 3 and actuator cartridge 4. The encapsulation of actuator 3 is required to protect actuator 3 from chemical damage by the fuel. On the other hand, actuator 3, already preassembled in actuator cartridge 4, is easier to install and, in addition, is protected from damage by mechanical stresses during the installation.

By way of a downstream-side end 6, actuator 3 is braced against an actuating member 7 having the form of a piston.

On the downstream side of actuating member 7 is a valve needle 8, which is set apart from actuating member 7 by a compensation gap 9. Valve needle 8 has on its downstream-side end 10 a valve-closure member 11, which forms a sealing seat together with a valve-seat surface 12 formed on housing 2 of fuel injector 1. The exemplary embodiment shows an outwardly opening fuel injector 1.

On the downstream side of compensation gap 9, valve needle 8 is guided by two guide elements 18 and 20. To return valve needle 8 when actuator 3 is non-energized, a restoring spring 19 is provided, which is clamped between valve-needle guide 20 and a disk 21 connected to valve needle 8 by force-locking.

According to the present invention, fuel injector 1 has a measuring element 13, which is located at an arbitrary location in an actuating path, which encompasses actuating member 7 and valve needle 8, between actuator 3 and valve-closure member 11. In the present first exemplary embodiment, measuring element 13 is disposed between an end face 14 of actuator cartridge 4 and an inflow-side end 15 of actuator 3. However, as shown in FIG. 1B, measuring element 13 may also be situated between the downstream-side end 6 of actuator 3 and actuating member 7, so that compression spring 5 is braced against measuring element 13.

Figure 1B:
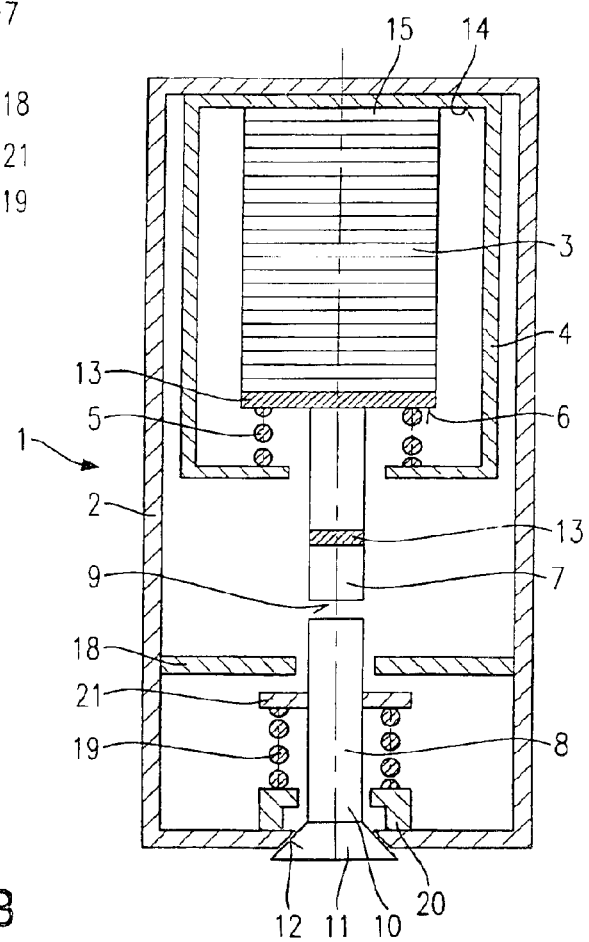
FIG. 1B shows a highly schematized, sectioned representation of a second exemplary embodiment of a fuel injector configured according to the present invention.

As an alternative, measuring element 13 may also be integrated in actuating member 7, as is shown in FIG. 1B as well. Furthermore, actuator 3 may be encapsulated in different ways and prestressed, too, which allows measuring element 13 to be positioned at different points in the flux of force. It must merely be ensured that measuring element 13 is positioned on the inflow side of compensation gap 9.

In order to control the width of compensation gap 9 formed between actuating member 7 and valve needle 8 in such a way that undesired opening phases of fuel injector 1 are prevented, these opening phases being caused by linear deformations of actuator 3 due to thermal effects, and in order to achieve a constant opening lift of valve needle 8, the present invention provides for measuring element 13. Measuring element 13 measures the forces exerted by actuator 3. By a control loop (not shown further), the actuator voltage and the voltage of a compensation actuator 16 may be regulated in such a way that a reliable play compensation is attained, without the dynamic properties of actuator 3 being affected in a detrimental manner.

Figures 2A, 2B:
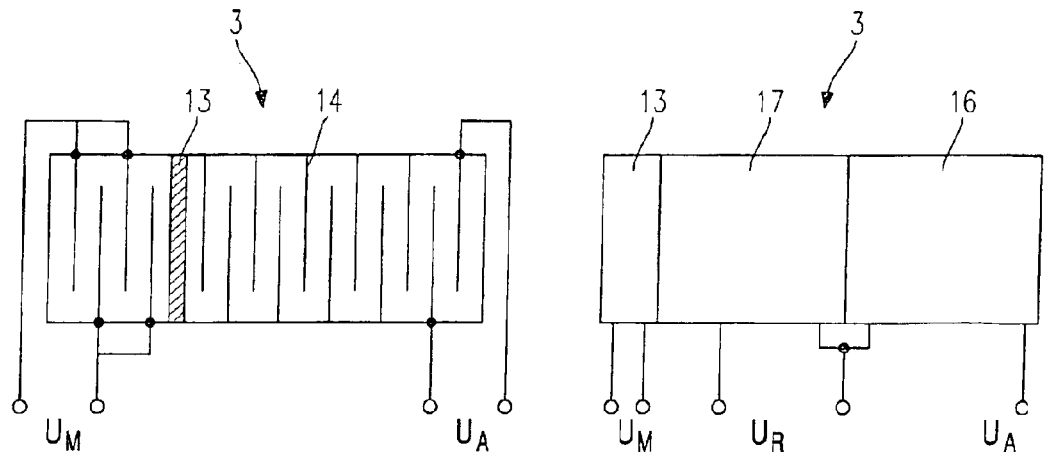
FIG. 2A shows a schematic view of a stack actuator of the fuel injector configured according to the present invention.
FIG. 2B shows a schematic view of an actuator of the fuel injector configured according to the present invention, the actuator having separate control regions.

FIGS. 2A and 2B show two exemplary embodiments of possible actuators 3. FIG. 2A shows a stack actuator 3, which is made up of individual piezoelectric layers 14. One or a plurality of layers 14 may be designed as compensation layers, or be configured as compensation actuator 16 in their entirety and integrated in stack actuator 3. Measuring element 13 is arranged at an arbitrary location inside stack actuator 3. A measuring voltage $U_M$ is tapped off on one side on actuator 3, so that the pressure force may be measured. Actuator voltage $U_A$ is applied on the other side of measuring element 13.

As shown in FIG. 2B, compensation actuator 16 may also be configured in the form of a separate compensation actuator 16, for instance. In this case, actuator 3, in its entirety, is made up of an opening actuator 17, a compensation actuator 16 and measuring element 13. Each part is separately controllable. Lines that are at the same potential, such as the ground lines, may also be brought together to simplify matters.

Figure 3A:
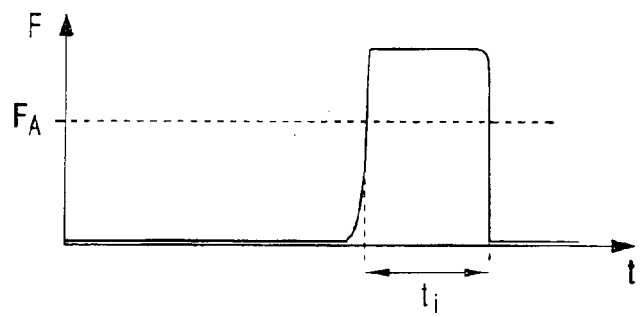
FIG. 3A shows a schematic representation of the time characteristic of the forces acting on the actuator, without a compensation actuator.
Figure 3B:
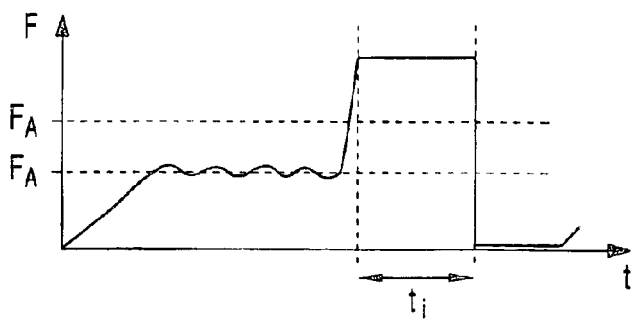
FIG. 3B shows a schematic representation of the time characteristic of the forces acting on the actuator, with a compensation actuator.

FIGS. 3A and 3B illustrate force F, which is exerted by actuator 3 and measured by measuring element 13.

In FIG. 3A, the sole force $F_A$ of opening actuator 17, which is formed either from the totality of layers 14 of stack actuator 3 acting in the opening direction according to FIG. 2A, or by one-piece compensation actuator 16 according to FIG. 2B, is represented as a function of time t. Due to the high dynamics of piezoelectric actuators 3, a nearly rectangular force characteristic is representable, which extends over opening time $t_i$. A play compensation is not possible here.

FIG. 3B shows the combined effect of opening actuator 17 and compensation actuator 16.

Between two injection cycles, a small excitation voltage is supplied to compensation actuator 16 by which compensation actuator 16 expands to the point where compensation gap 9 is closed. Measuring element 13 detects closed compensation gap 9 by an increase in the pressure force acting on measuring element 13. The play compensation is ended at a point at which the pressure force is not yet sufficient to actuate valve needle 8. To compensate for the temperature-related changes in length, the play compensation is implemented more slowly than the opening operation of fuel injector 1.

If fuel injector 1 is activated by actuating opening actuator 17, compensation gap 9 is closed and the movement of opening actuator 17 is immediately transmitted to valve needle 8 via actuating element 7. The excitation voltage for compensation actuator 16 maybe maintained during the open phase of fuel injector 1 or it may be switched off in order to damp valve needle 8.

When fuel injector 1 is closed, both excitation voltages are switched off, so that all actuator regions return to their neutral state for the next injection cycle.

Alternatively, compensation actuator 16 may also be kept under voltage over the entire injection cycle. The play compensation may then be carried out continually. A charge loss of the compensation actuator may be compensated for by recharging. During the injection intervals, measuring element 13 checks that the allowed maximum force of the compensation actuator is not exceeded, in order to prevent an undesired opening of fuel injector 1. Compensation actuator 16 may be discharged continually or in a step-by-step manner, or may be separated from the voltage source completely. In the process, corresponding algorithms of the control loop take into account the temperature of fuel injector 1, temperature changes, the load state of the internal combustion engine as well as learned values from preceding injection cycles.

The present invention is not limited to the exemplary embodiments shown and applicable, for instance, also to magnetostrictive actuators 3, for arbitrary designs of measuring elements 13 and various designs of fuel injectors 1.

What is claimed is:

1. A fuel injector for performing a direct injection of a fuel into a combustion chamber of an internal combustion engine, comprising:
   a valve-seat surface;
   one of a piezoelectric actuator and a magnetostrictive actuator;
   a valve-closure member actuatable by the one of the piezoelectric actuator and the magnetostrictive actuator, the valve-closure member cooperating with the valve-seat surface to form a sealing seat, a compensation gap being present in an actuation path between the valve closure member and the one of the piezoelectric actuator and the magnetostrictive actuator; and
   a measuring element provided in at least one of the actuation path and the one of the piezoelectric actuator and the magnetostrictive actuator, wherein:
   the measuring element measures a force exerted by the one of the piezoelectric actuator and the magnetostrictive actuator on the valve-closure member, and
   the one of the piezoelectric actuator and the magnetostrictive actuator is regulated in such a way that the compensation gap is held closed.

2. The fuel injector as recited in claim 1, further comprising:
   an actuating member that is in an operative connection with the one of the piezoelectric actuator and the magnetostrictive actuator; and
   a valve needle that is in an operative connection with the valve-closure member, wherein:
   the actuation path encompasses the actuating member.

3. The fuel injector as recited in claim 2, wherein:

the compensation gap is formed between the actuating member and the valve needle.

4. The fuel injector as recited in claim 2, wherein:

the measuring element is integrated in the actuating member.

5. The fuel injector as recited in claim 1, wherein:

the one of the piezoelectric actuator and the magnetostrictive actuator includes an opening actuator and a compensation actuator.

6. The fuel injector as recited in claim 5, wherein:

the opening actuator and the compensation actuator include one of individual piezoelectric layers and individual magnetostrictive layers, and the opening actuator and the compensation actuator form a joint stack actuator.

7. The fuel injector as recited in claim 6, wherein:

the measuring element encompasses at least one of a plurality of layers of the joint stack actuator.

8. The fuel injector as recited in claim 5, wherein:

the compensation actuator and the opening actuator form separate regions of the one of the piezoelectric actuator and the magnetostrictive actuator.

9. The fuel injector as recited in claim 1, further comprising:

an actuator cartridge within which the one of the piezoelectric actuator and the magnetostrictive actuator is encapsulated.

10. The fuel injector as recited in claim 9, further comprising:

a compression spring for maintaining the one of the piezoelectric actuator and the magnetostrictive actuator prestressed in the actuator cartridge.

11. The fuel injector as recited in claim 9, wherein:

the measuring element is arranged inside the actuator cartridge.

12. The fuel injector as recited in claim 9, wherein:

the measuring element is arranged at any location outside the actuator cartridge in a flux of force.

* * * * *